United States Patent
Iida (10) Patent No.: US 6,933,197 B2
(45) Date of Patent: Aug. 23, 2005

(54) METHOD OF MANUFACTURING SEMICONDUCTOR DEVICE

(75) Inventor: Izuo Iida, Tochigi (JP)

(73) Assignee: Sanyo Electric Co., Ltd., Osaka (JP)

(*) Notice: Subject to any disclaimer, the term of this patent is extended or adjusted under 35 U.S.C. 154(b) by 0 days.

(21) Appl. No.: 09/876,554

(22) Filed: Jun. 7, 2001

(65) Prior Publication Data

US 2002/0016040 A1 Feb. 7, 2002

(30) Foreign Application Priority Data

Jun. 9, 2000 (JP) .......................................... 2000-173356
Jun. 9, 2000 (JP) .......................................... 2000-173357

(51) Int. Cl.⁷ .......................................... H01L 21/336
(52) U.S. Cl. ........................ 438/264; 438/258; 438/266
(58) Field of Search ................................. 438/257, 258, 438/260, 264, 266

(56) References Cited

U.S. PATENT DOCUMENTS

| | | | |
|---|---|---|---|
| 5,104,819 A | * | 4/1992 | Freiberger et al. .......... 438/593 |
| 5,656,522 A | * | 8/1997 | Komori et al. .......... 438/258 |
| 5,856,221 A | * | 1/1999 | Clementi et al. .......... 438/258 |
| 5,879,993 A | | 3/1999 | Chien et al. |
| 6,165,845 A | * | 12/2000 | Hsieh et al. .......... 438/260 |
| 6,365,459 B1 | * | 4/2002 | Leu .......... 438/266 |

FOREIGN PATENT DOCUMENTS

| | | |
|---|---|---|
| EP | 0305741 A2 | 3/1989 |
| EP | 0454051 A | 10/1991 |
| JP | 03-009572 | 1/1991 |
| JP | 11-68070 | 3/1999 |
| JP | 11-068070 | 3/1999 |

* cited by examiner

Primary Examiner—George Eckert
Assistant Examiner—N. Drew Richards
(74) Attorney, Agent, or Firm—Fish & Richardson P.C.

(57) ABSTRACT

A non-volatile memory cell and a high voltage MOS transistor on the same semiconductor chip without changing the characteristic of the non-volatile memory cell. A gate insulating film of a MOS transistor is formed using the steps of forming an oxide film 12 formed on a floating gate 14 of a split-gate type non-volatile memory cell and of forming a tunneling insulating film 16 formed on the floating gate 14 and the oxide film 12. The gate insulating film 13 of the MOS transistor is formed by a stacked layer of the oxide film 12 and tunneling insulating film 16. Thus, the quantity of heat treatment in the entire production process undergoes no change, and the optimized characteristic of the non-volatile memory undergoes no change.

13 Claims, 12 Drawing Sheets

METHOD OF MANUFACTURING SEMICONDUCTOR DEVICE

BACKGROUND OF THE INVENTION

This invention relates to a method of manufacturing a semiconductor device having a non-volatile memory cell transistor with an insulated floating gate and a control gate and a MOS transistor with a single insulated gate on the same semiconductor substrate, and more particularly to a method of manufacturing a semiconductor device in which high (or high withstand) voltage MOS transistors can be integrated on the same semiconductor substrate without changing the characteristic of a non-volatile memory cell transistor.

Previously known LSI memories are non-volatile semiconductor memories such as a mask ROM, PROM (Programmable ROM), EPROM (Erasable and Programmable ROM), EEPROM (Electrical Erasable and Programmable ROM), etc.

Particularly, in the EPROM or EPROM, data storage is carried out in such a manner that charges are accumulated on the floating gate and a change in a threshold voltage due to the presence or absence of the charges is detected by the control gate. The EEPROM includes a flash EEPROM (that is also referred to a flash memory) in which data are erased for the whole memory chip or for each of some blocks into which an non-volatile semiconductor memory cell array are divided.

Figure 12:
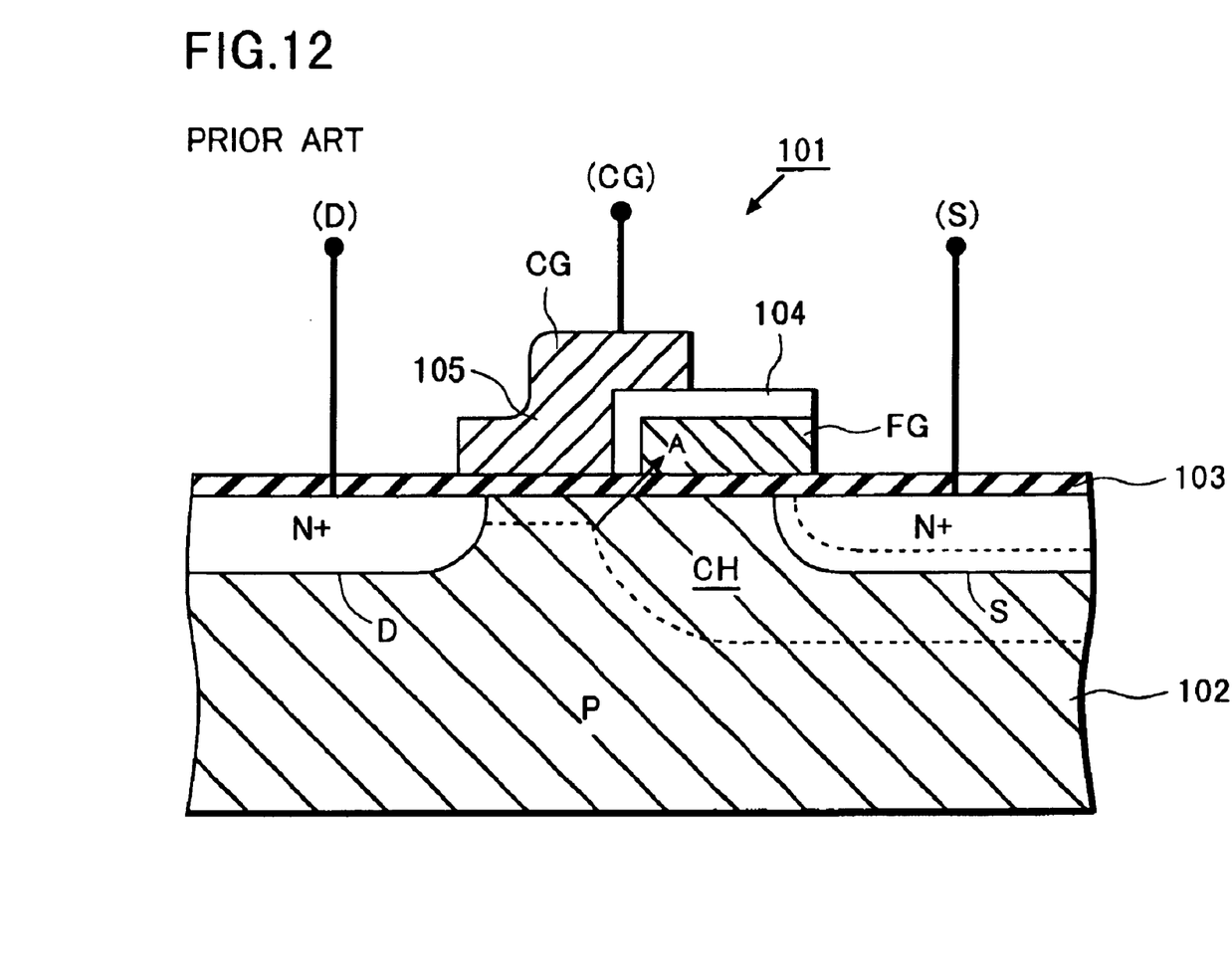
FIG. 12 is a sectional view showing a split gate type non-volatile semiconductor memory cell.

The non-volatile memory cells which constitute the flash EEPROM are roughly classified into a split gate type and stack gate type. The split gate type flash EEPROM is disclosed in WO92/18980 (G11C13/00). FIG. 12 shows a sectional structure of a split gate type non-volatile semiconductor memory cell 101 described in the publication WO92/18980.

For example, an N type source S and an N type drain D are formed on a P type single-crystal silicon (Si) substrate 102. A floating gate FG is formed through a first insulating film 103 on a channel CH formed between the source S and drain D. A control gate CG is formed through a second insulating gate 104 on the floating gate FG.

The control gate CG is partially arranged through the first insulating film on the channel CH so as to constitute a selecting gate 105. Storage of data is carried out in such a manner that hot electrons are injected into the floating gate FG encircled by the second insulating film ("tunneling insulating film").

On the other hand, the data accumulated in the floating gate are erased in such a manner that a prescribed voltage is applied to the control gate CG so as to cause a tunneling current to flow from the floating gate FG through the second insulating gate 104.

Meanwhile, in recent years, a system in which the above flash EEPROM is mounted on the logic IC or microcomputer has been developed rapidly. In such a system LSI, e.g. microcomputer operating at 5 V, there is a case where an external signal of 10 V is applied to its I/O circuit. This required a high withstand voltage to be newly added.

The high voltage MOS transistor has a higher gate withstand voltage than a conventional type MOS transistor formed on the same chip.

Further, it has been investigated to incorporate a circuit which has another function and operates at a high supply voltage in the microcomputer with the flash EEPROM mounted. For example, in the system for a portable telephone, a control circuit for a lithium battery is mounted a one-chip microcomputer. In this control circuit, a high voltage of about 30 V is applied to the MOS transistor constituting the control circuit so that the high voltage MOS transistor with a further improved withstand voltage (gate withstand voltage, source-drain withstand voltage) must be integrated on the same chip.

The high voltage MOS transistor (withstand voltage of e.g. 30 V), in which a high voltage is applied to the gate electrode, must have a thicker gate insulating film than that of the conventional type MOS transistor (withstand voltage of e.g. 5 V) which constitutes the logic circuit of the microcomputer.

However, addition of a step of gate oxidation dedicated to the high voltage MOS transistor gives rise to a problem of increasing the amount of heat treatment in the manufacturing process to change the characteristic of a non-volatile memory cell, e.g. the threshold voltage or the current value of the memory cell.

SUMMARY OF THE INVENTION

Therefore, an object of this invention is to provide a method of manufacturing a non-volatile memory cell and a high voltage MOS transistor on the same semiconductor chip without changing the characteristic of a non-volatile memory cell.

Another object of this invention is to provide a method of manufacturing a non-volatile memory cell and a high voltage MOS transistor on the same semiconductor chip without increasing the number of man-hours of manufacturing.

This invention basically intends to form a gate insulating film of a high voltage MOS transistor using an oxidation step (including CVD step) inherently included in the step of manufacturing a non-volatile memory.

The gate insulating film of the high voltage MOS transistor must be formed thick according to a required withstand voltage. Therefore, this invention intends to form the gate insulating film of the MOS transistor simultaneously using the step of forming an oxide film formed on the floating gate of a split type non-volatile memory cell and the step of forming a tunnel insulating film formed on the floating gate and the oxide film.

Thus, the gate insulating film of the MOS transistor is formed by a stacked film of the oxide film and tunnel insulating film. On the basis of the investigation by the inventors of this invention, this gate insulating film is enough to realize the withstand voltage of about 30 V. The oxidation film for forming the gate insulating film of the MOS transistor is inherently included in the step of forming the non-volatile memory cell. For this reason, the quantity of heat treatment in the entire production process undergoes no change, and the optimized characteristic of the non-volatile memory undergoes no change.

Further, by selectively removing the tunneling insulating film as the need arises, the gate insulating film of the MOS transistor can be formed only by the oxide film. Therefore, the gate insulating film of the MOS transistor is formed thin by the degree of the tunneling insulating film. Namely, two choices scan be prepared for the thickness of the gate insulating film of the MOS transistor according to the withstand voltage characteristic as required.

DETAILED DESCRIPTION OF THE PREFERRED EMBODIMENTS (First Embodiment)

Now referring to the drawings, an explanation will be given of a method of manufacturing a semiconductor device according to a first embodiment of this invention. FIGS. 1 to 6 are sectional views of the semiconductor device in respective steps.

Figure 1:
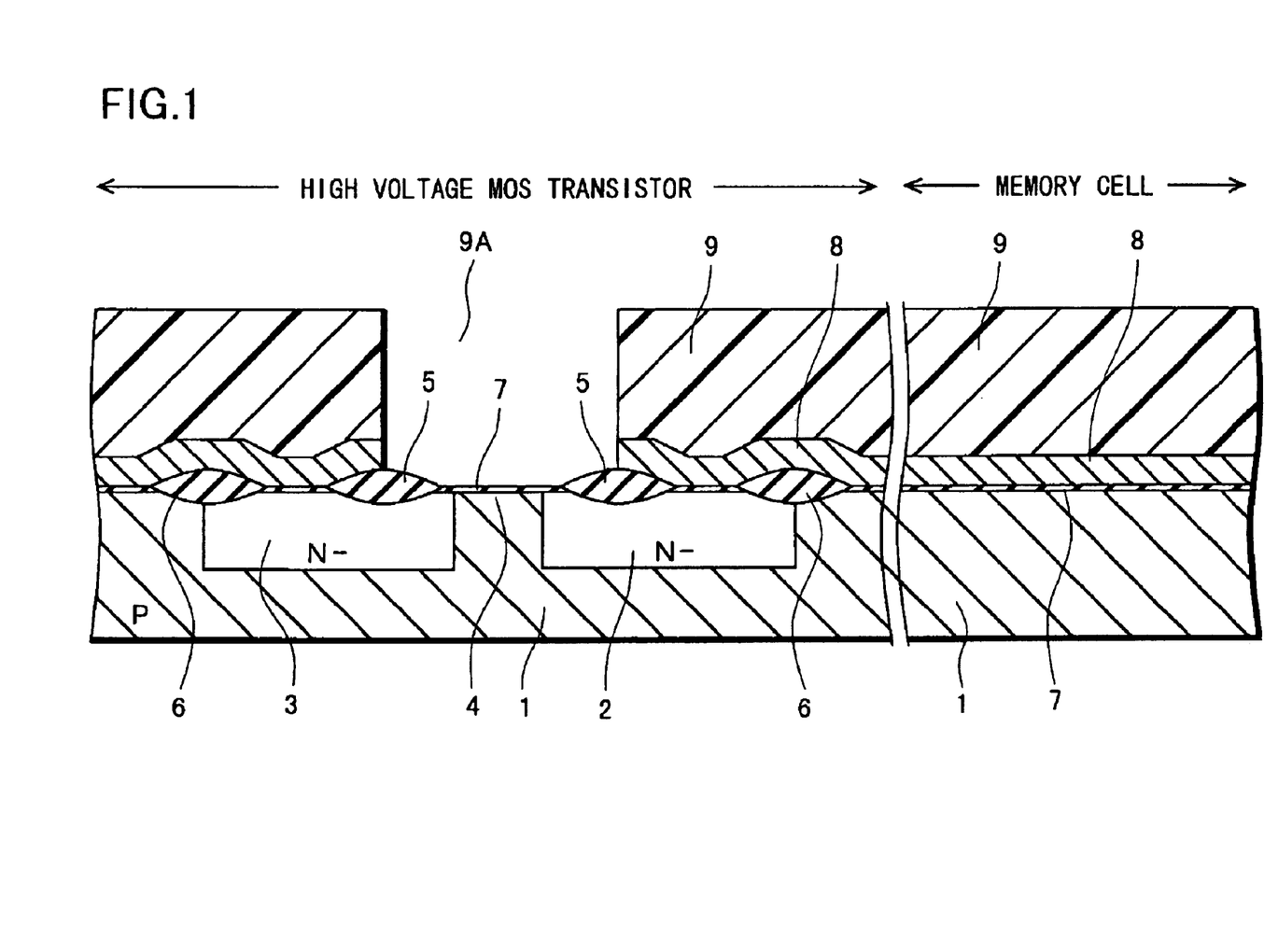
FIG. 1 is a sectional view showing a method of manufacturing a semiconductor device according to a first embodiment of this invention.

FIG. 1 shows the region at a left part where a high voltage MOS transistor is to be formed and the region at a right part where a memory cell is to be formed (this also applies to FIGS. 2 to 6).

Specifically, an $n^-$ type source layer 2 and an $n^-$ type drain layer 3 are formed apart from each other on the surface of a p type silicon (Si) substrate 1. The surface of the p type Si substrate between the $n^-$ type source layer 2 and the $n^-$ type drain layer 3 constitute a channel region 4.

The $n^-$ type source layer 2 and $n^-$ type drain layer 3, although not particularly limited, are formed to have a depth of about 3 $\mu$m by ion-implanting phosphorous with a dose of $1 \times 10^{13}/cm^2$ in the p type Si substrate 1, and thereafter thermally diffusing the implanted ions for about 3 hours at a temperature of 1000° C.

Thereafter, field oxide films 5 and 6 are formed by the selective oxidation method. These films are generally called "LOCOS". The field oxide films 5 and 6 have a thickness of about 400 nm. The field oxide film 5 is the LOCOS included in the region of the n− type source layer 2 and $n^-$ type drain layer 3 to improve the withstand voltage between the gate and source and that between the gate and drain. The field oxide film 6 is the LOCOS for element isolation.

Thereafter, a thin gate insulating film 7 having a thickness of about 8 nm is formed on the entire surface inclusive of the memory cell region by thermal oxidation. Further, a poly-Si layer 8 having a thickness of about 200 nm and doped with phosphorous is formed on the entire surface by the LPCVD method. An amorphous silicon (Si) may be substituted for the poly-Si layer 8.

By the photolithography technique, a photoresist layer 9 having an opening 9A is formed in the region where the gate insulating film of the high voltage MOS transistor is to be formed. Using the photoresist layer 9 as a mask, the poly-Si layer 8 on the region where the gate insulating layer is to be formed is etched away.

Figure 2:
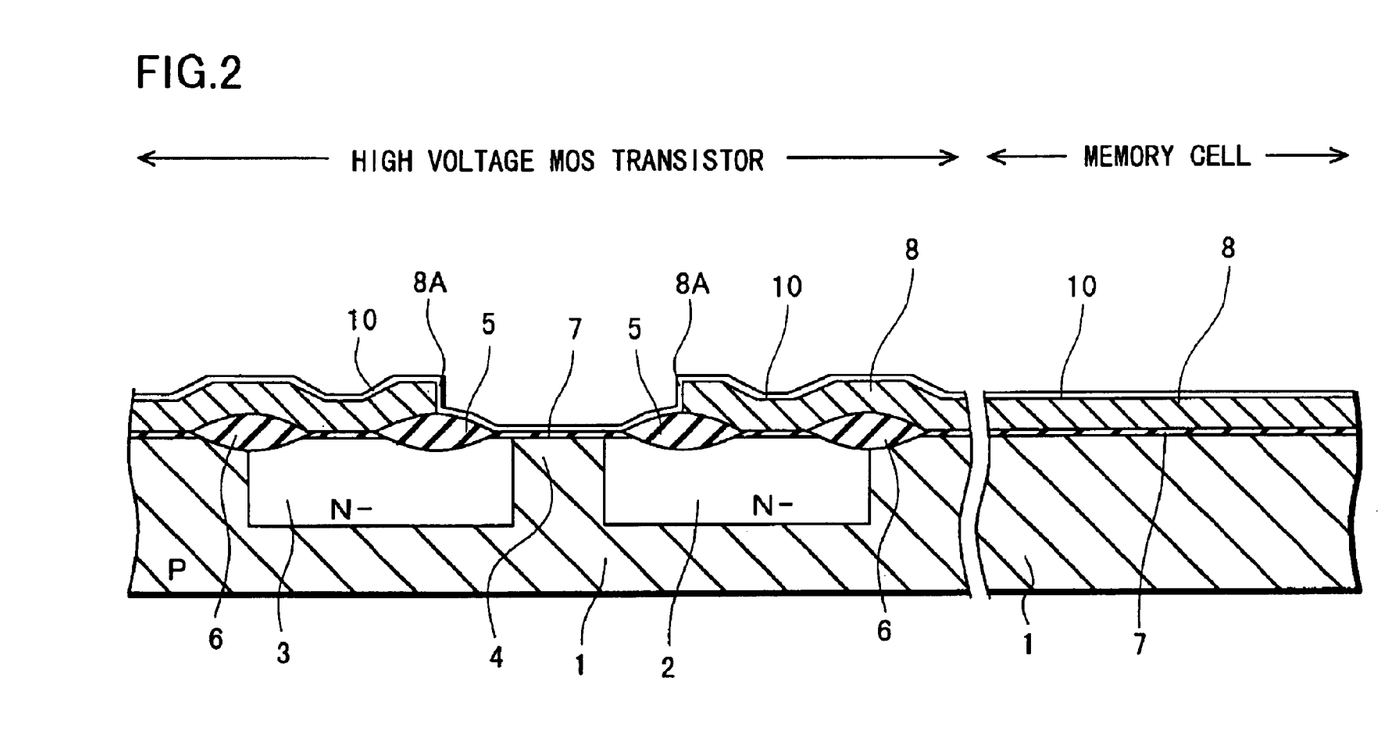
FIG. 2 is a sectional view showing a method of manufacturing a semiconductor device according to the first embodiment of this invention.

As seen from FIG. 2, after the photoresist layer 9 has been removed, by the LPCVD method, a silicon nitride ($Si_3N_4$) film 10 having a thickness of about 20 nm is deposited on the entire surface. At this time, the side 8A of the poly-Si layer 8 subjected to etching is covered with the silicon nitride film 10. The silicon nitride film 10 serves as an oxidation-resistant film in a thermal oxidation step described later.

Figure 3:
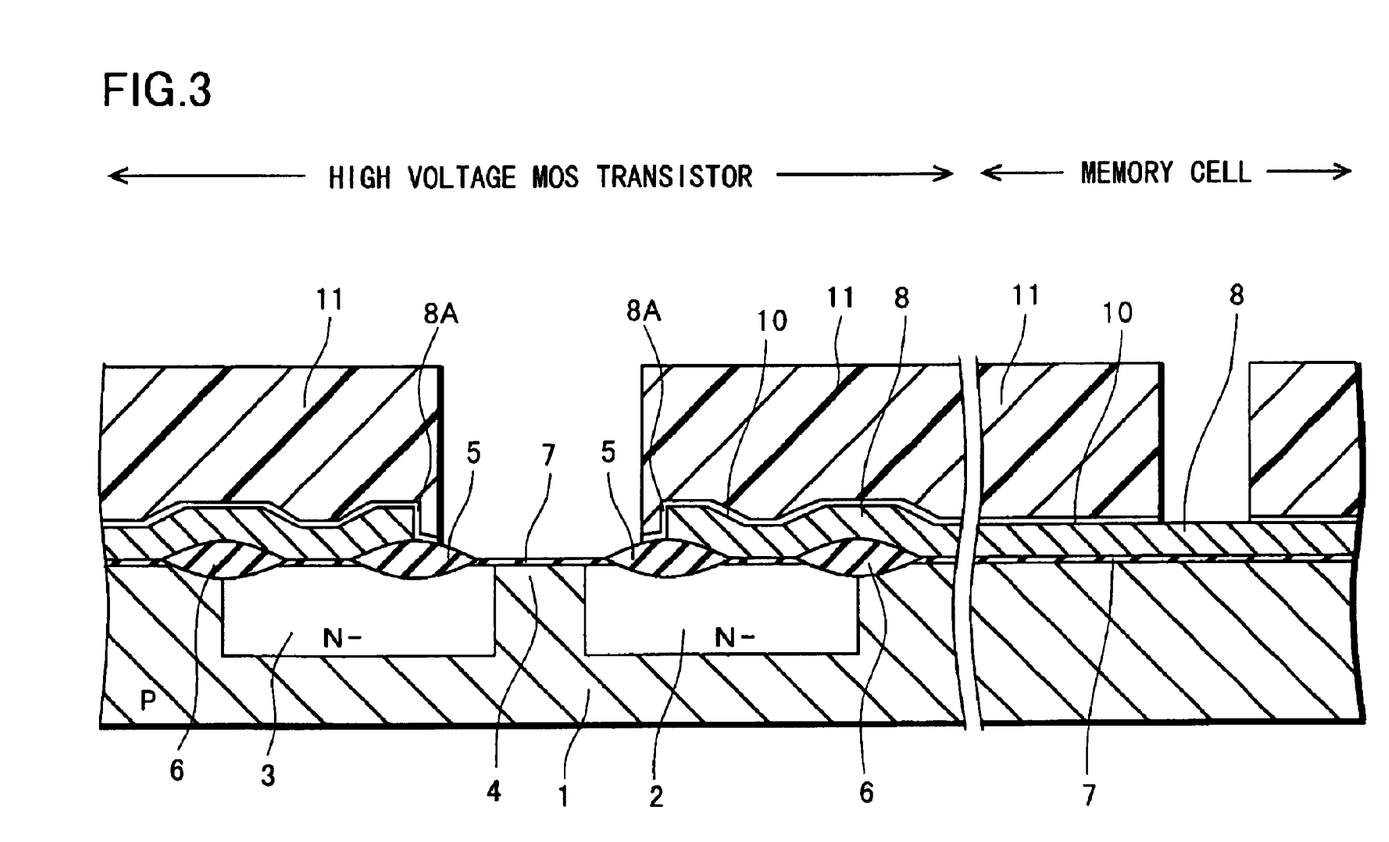
FIG. 3 is a sectional view showing a method of manufacturing a semiconductor device according to the first embodiment of this invention.

As seen from FIG. 3, by photolithography, a photoresist layer 11 having an opening in the region where the gate insulating film is to be formed and another opening in the region where a floating gate to be formed is formed. Using the photoresist film 11 as a mask, the silicon nitride film 10 is etched away. Thereby, a silicon nitride film 10 on the region where the gate insulating film is to be formed and on the region where the floating gate is to be formed is selectively removed. In this case, the position of the edge of the opening of the photoresist layer 11 is adjusted so that the state where the side 8A of the poly-Si layer 8 is covered with the silicon nitride film 10 is maintained.

Figure 4:
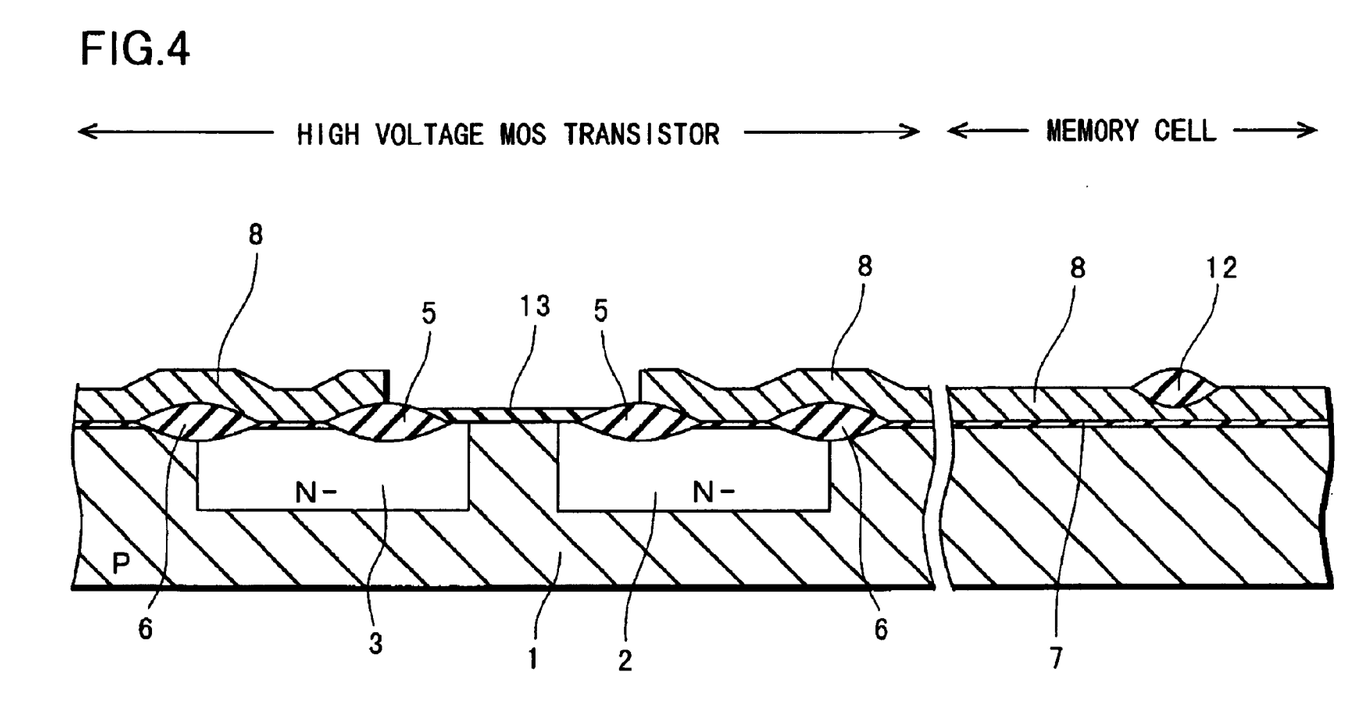
FIG. 4 is a sectional view showing a method of manufacturing a semiconductor device according to the first embodiment of this invention.

As seen from FIG. 4, after the photoresist layer 11 has been removed, by the thermal oxidation, an oxide ($SiO_2$) film 12 in a LOCOS shape is formed on the region where a floating gate is to formed. As described later, the oxide film 12 is formed thick in order to weaken the capacitive coupling between a control gate 17 and a floating gate 14.

Further, the oxidizing condition (temperature, time) of the oxide film 12 is adjusted to be provide a thickness of about 150 nm. Specifically, the oxide film 12 is formed by the "selective oxidation" using the silicon nitride film 10 as an oxidation resisting film. During this thermal oxidation step, a thick gate insulating film 13 having a thickness of about 150 nm is also formed in the region where the high voltage MOS transistor is to be formed.

In this case, since the side 8A of the polysilicon layer 8 is covered with the silicon nitride film 10, oxidation of this side 8A is prevented. If the side 8A of the polysilicon layer 8 is oxidized, a piece of the oxide film will remain in the removal of the polysilicon layer 8 in a later step. Peeling-off of the piece of the oxide film will generate dust. Because the side 8A of the polysilicon layer 8 is covered with the silicon nitride film 10, its oxidation is prevented.

Figure 5:
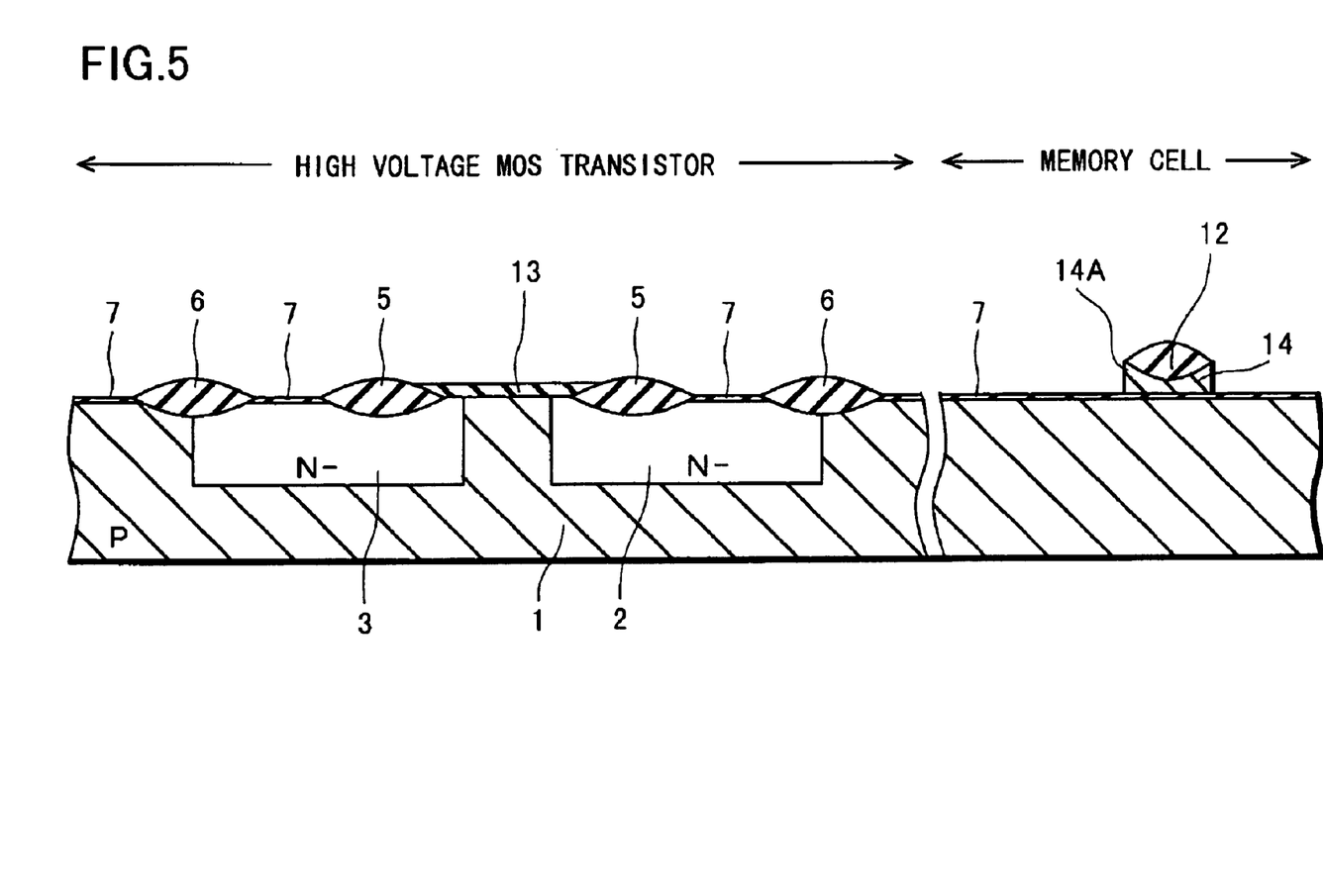
FIG. 5 is a sectional view showing a method of manufacturing a semiconductor device according to the first embodiment of this invention.

After the silicon nitride film 10 has been removed, as seen from FIG. 5, using the oxidation film 12 in the LOCOS shape as a mask, the poly-Si layer 8 is etched so that the floating gate 14 is formed beneath the oxide film 12 in the LOCOS shape. The poly-Si layer 8 is preferably etched by e.g. completer is anisotropic etching to provide high etching accuracy. In this case, a mixed gas of e.g. HBr and $Cl_2$ is used as an etching gas.

As a result, the corner 14A of the floating gate 14 is processed into an acute shape. Hence, a tunneling current becomes likely to flow the floating gate to the control gate.

Figure 6:
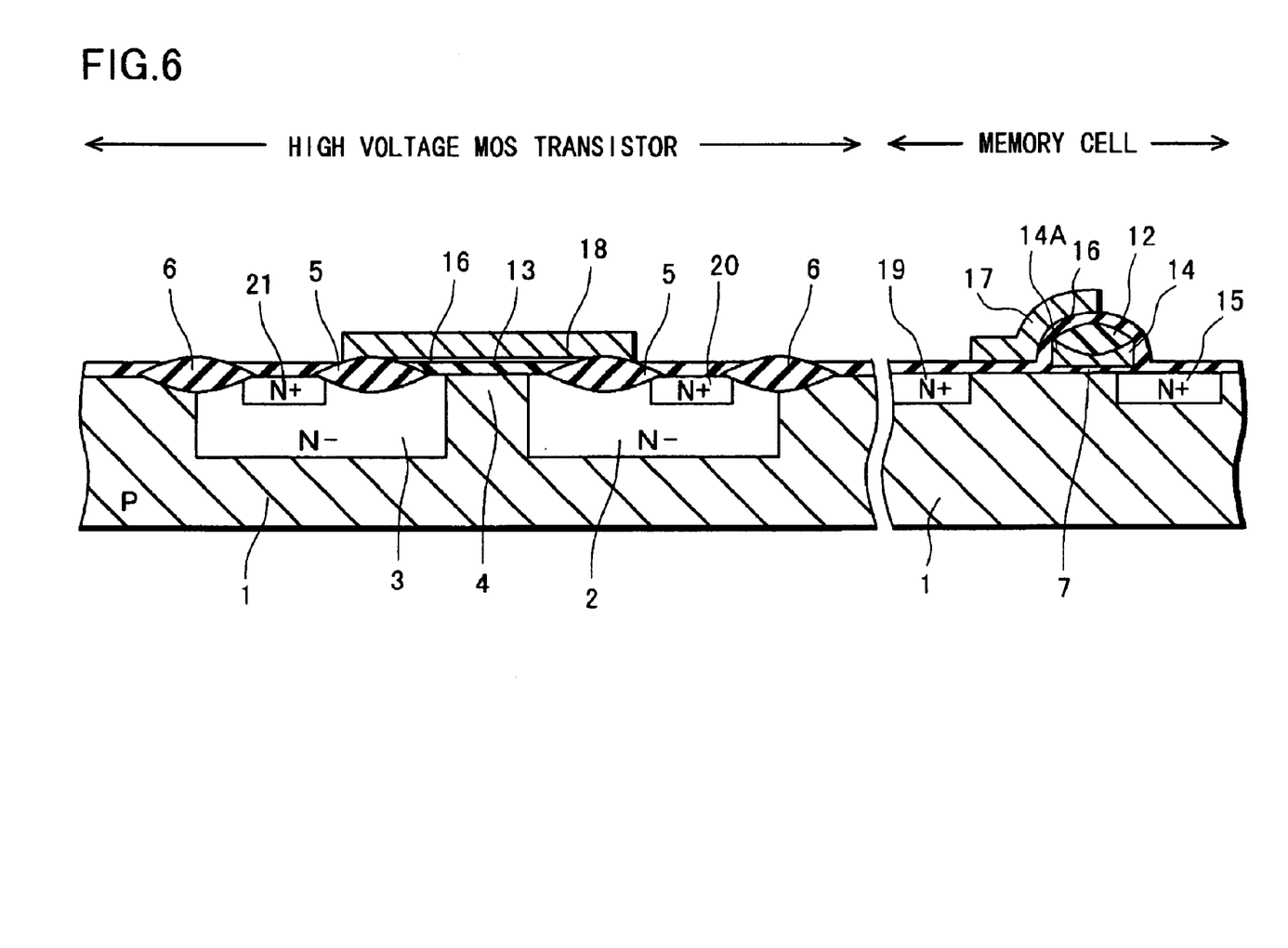
FIG. 6 is a sectional view showing a method of manufacturing a semiconductor device according to the first embodiment of this invention.

Next, as seen from FIG. 6, an $n^+$ source diffused layer 15 is formed at the one end of the floating gate 14 by ion-implanting boron and thermally diffusing the implanted ions. Further, a tunneling insulating film 16 having a thickness of about 20 nm is formed to cover the floating gate 14 and oxide film 12 of the non-volatile memory cell. The tunneling insulating film 16 can be formed by thermal oxidation and CVD technique.

Thus, the upper surface and side surface of the floating gate 14 are covered with the tunneling insulating film 16. The tunneling insulating film 16 is formed on the entire surface of the substrate 1. Therefore, the tunneling insulating film 16 is superposed on the thick gate insulating film 13 of the high voltage MOS transistor. Correspondingly, the effective film thickness of the gate insulating film of the high voltage MOS transistor can be increased.

By selectively etching the tunnel insulating film 16 formed on the thick gate insulating film 13, the thickness of the gate insulating film of the high voltage MOS transistor can be made equal to that of the thick gate insulating film 13.

It should be noted that the conventional type MOS transistor is also formed on the same Si substrate 1. The above thin gate insulating film 7 is used as the gate insulating film of the conventional type MOS transistor. Therefore, the tunneling insulating film 16 superposed on the thin gate insulating film 7 is selectively etched away. This etching step can be executed simultaneously with the step of selectively etching the tunneling insulating film 16 formed on the above thick gate insulating film 13.

Thereafter, the surface of the Si substrate 1 is cleaned by the ordinary technique. A poly-Si layer having a thickness of about 200 nm and doped with phosphorous is formed on the entire surface of the substrate by the LPCVD method.

The poly-Si layer is selectively etched by the photolithography technique so that a control gate 17 of the non-volatile memory cell and the gate 18 of the high voltage MOS transistor are formed. In this case, the control gate 17 of the non-volatile memory cell is formed over the area extending from the floating gate 14 to the p type Si substrate 1.

Thereafter, by ion-implanting arsenic, formed are an n+ type drain region 19 of the non-volatile memory cell and an n+ type source diffused layer 20 and an n+ type drain diffused layer 21 of the high voltage MOS transistor.

Through the manufacturing process described above, the non-volatile memory cell and high voltage MOS transistor can be formed on the same Si substrate 1. A brief explanation will be given of the operation of the non-volatile memory cell.

In the write of data in the non-volatile memory cell, for example, a voltage of about 2 volt is applied to the control gate 17 and higher voltage of about 12 volt is applied to the n+ type source diffused layer 15. Since the n+ type source diffused layer 15 and floating gate 14 are strongly capacitive-coupled with each other, channel hot electrons flowed from the n+ type drain diffused layer 19 are injected into the floating gate 14.

In the erasure of data, with the n+ source diffused layer 15 and n+ drain diffused layer 19 connected to ground, a high voltage of about 15 volt is applied to the control gate 17. Therefore, the electrons in the floating gate 14 provide a tunneling current passing through the tunneling insulating film 16 which flows into the control gate 17. In this case, since the corner 14A of the floating gate 14 is processed into the acute shape, the tunneling current is apt to flow, thereby enhancing the efficiency of erasure.

The oxide film 12 serves to weaken the capacitive coupling between the control gate 17 and the floating gate 14. Thus, the capacitive coupling between the floating gate 14 and the n+ type source diffused layer 15 is relatively strengthened. Therefore, in the write of data, when the high voltage is applied to the n+ source diffused layer 15, the potential of the floating gate 14 is enhanced by capacitive coupling. Accordingly, the efficiency of the hot electrons into the floating gate 14 is enhanced.

On the other hand, in the erasure of data, when the high voltage is applied to the control gate 14, the potential of the floating gate 14 approaches the potential of the n+ source diffused layer 15. Thus, a high electric field is generated between the control gate 17 and the floating gate 14. Therefore, a large tunneling current flows from the floating gate 14 to the control gate 17 so that the efficiency of erasure of data is improved.

In this way, the non-volatile memory cell stores a binary (multi-level) data of 1 or 0 on the basis of the change in the channel conductivity corresponding to the accumulated state of electrons in the floating gate 14, and can erase these data.

On the other hand, in the high voltage MOS transistor, the gate insulating film 13 is as thick as about 150 nm. In addition, the thick LOCOS layer 5 exists between the $n^+$ type source diffused layer 20/$n^+$ drain diffused layer 21 and the gate electrode 18. Further, the $n^+$ source diffused layer 20 and $n^+$ type drain diffused layer 21 are formed within the lightly-doped $n^-$ type source layer 2 and $n^-$ type drain layer 3, respectively. Because of such a configuration, the high voltage of about 30 V is applied to any terminal of source, drain and gate, these terminals can endure such a voltage.

Further, since the gate insulating film 13 is formed using the thermal oxidation step of forming the oxide film 12, the quantity of heat treatment optimized to form the non-volatile memory cell does not vary. This prevents the characteristic of the non-volatile memory cell from being varied.

Further, in the step of the thermal oxidation, the side 8A of the poly-Si layer 8 is covered with the silicon nitride film so that oxidation of the side 8A is prevented. This prevents the oxide film at the side wall from remaining on the LOCOS film 5 to generate dust, or the flatness of an interlayer insulating film formed as an overlying layer from being impaired.

(Second Embodiment)

Now referring to the drawings, an explanation will be given of a method of manufacturing a semiconductor device according to the second embodiment of this invention. FIGS. 7 to 11 are sectional views of the semiconductor device in respective steps.

Figure 7:
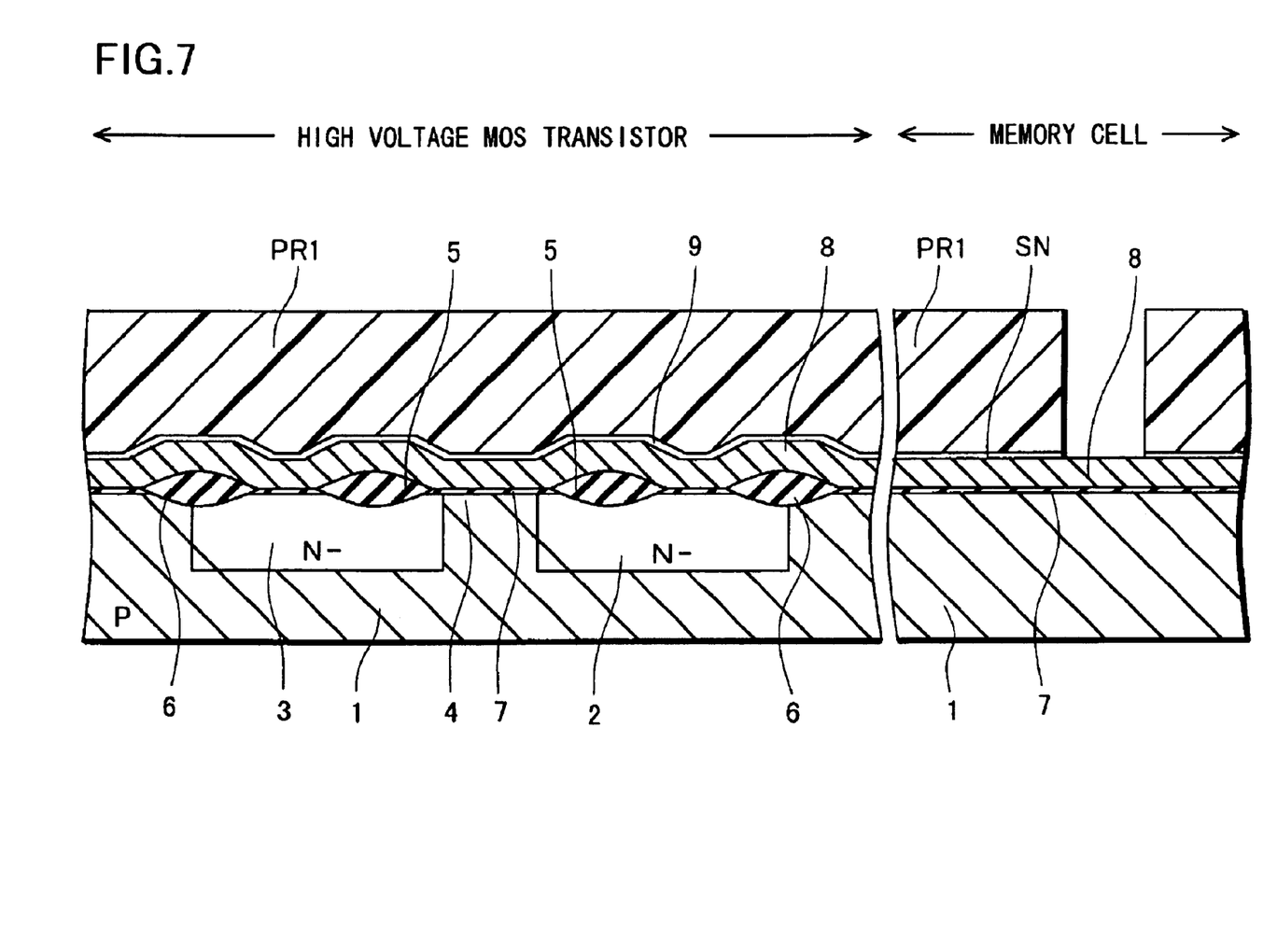
FIG. 7 is a sectional view showing a method of manufacturing a semiconductor device according to a second embodiment of this invention.

FIG. 7 shows the region at a left part where a high voltage MOS transistor is to be formed and the region at a right part where a memory cell is to be formed (this also applies to FIGS. 8 to 11).

Specifically, an $n^-$ type source layer 2 and an $n^-$ type drain layer 3 are formed apart from each other on the surface of a p type silicon (Si) substrate 1. The surface of the p type Si substrate between the $n^-$ type source layer 2 and the $n^-$ type drain layer 3 constitutes a channel region 4.

The $n^-$ type source layer 2 and $n^-$ type drain layer 3 are formed to have a depth of about 3 μm by ion-implanting phosphorous with a dose of $1 \times 10^{13}/cm^2$ in the p type Si substrate 1, and thereafter thermally diffusing the implanted ions for about 3 hours at a temperature of 1000° C.

Thereafter, field oxide films 5 and 6 are formed by the selective oxidation method. These films are generally called "LOCOS". The field oxide films 5 and 6 have a thickness of about 400 nm. The field oxide film 5 is the LOCOS included in the region of the $n^-$ type source layer 2 and $n^-$ type drain layer 3 to improve the withstand voltage between the gate and source and that between the gate and drain. The field oxide film 6 is the LOCOS for element isolation.

Thereafter, in this embodiment, a silicon nitride film SN having a thickness of about 20 nm is formed on the poly-Si layer 8. By the photolithography technique, a photoresist layer PR1 with an exposed region of the non-volatile memory cell where a floating gate is to be formed is formed, and the silicon nitride film SN on this region is removed by etching.

Figure 8:
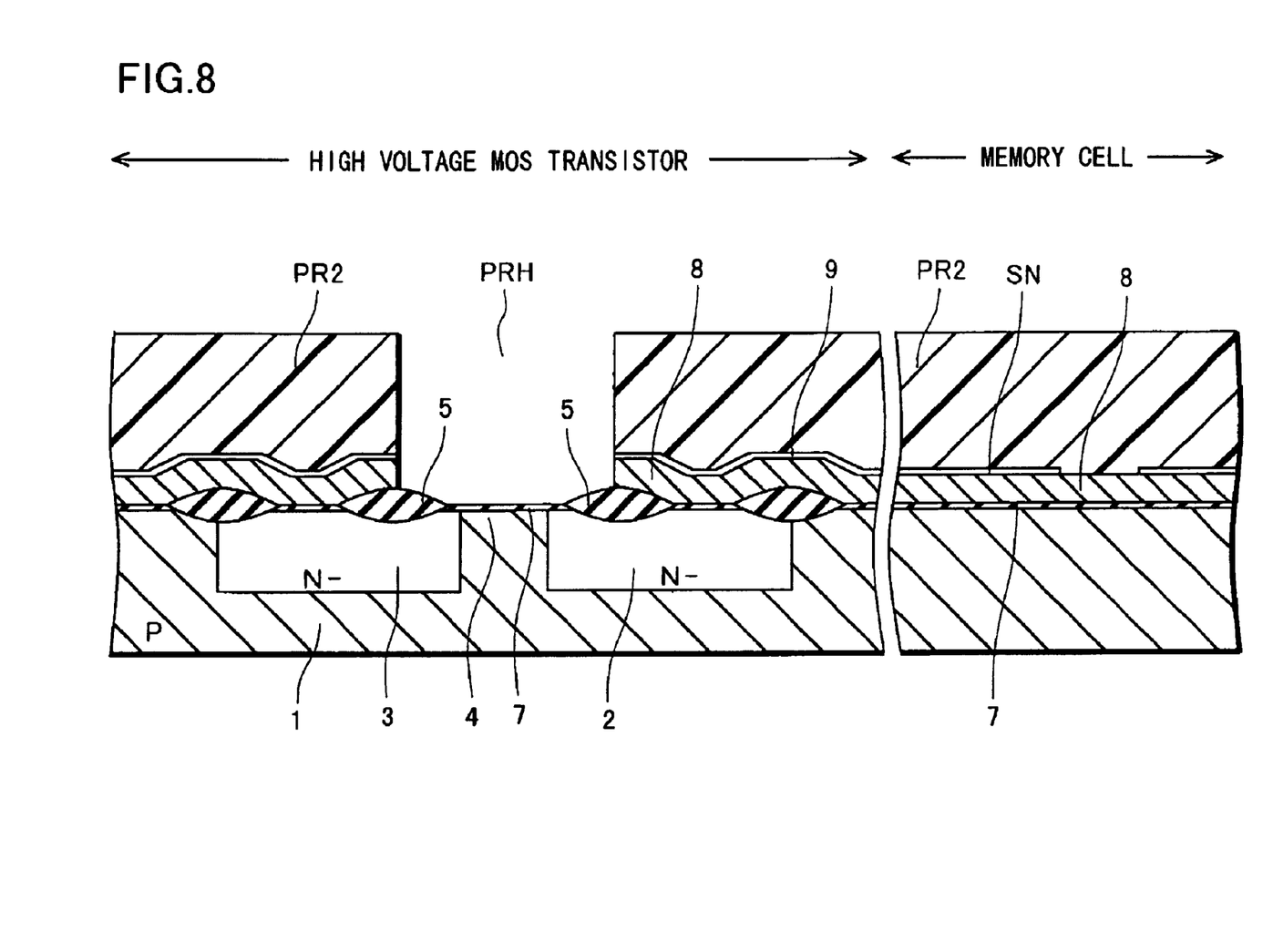
FIG. 8 is a sectional view showing a method of manufacturing a semiconductor device according to the second embodiment of this invention.

Next, as seen from FIG. 8, after the photoresist layer PR1 has been removed, a photoresist layer PR2 having an opening PRH in the region where a high voltage MOS transistor is to be formed is formed, and the poly-Si layer 8 and the silicon nitride film SN in the region where the high voltage MOS transistor is to be formed are removed.

Figure 9:
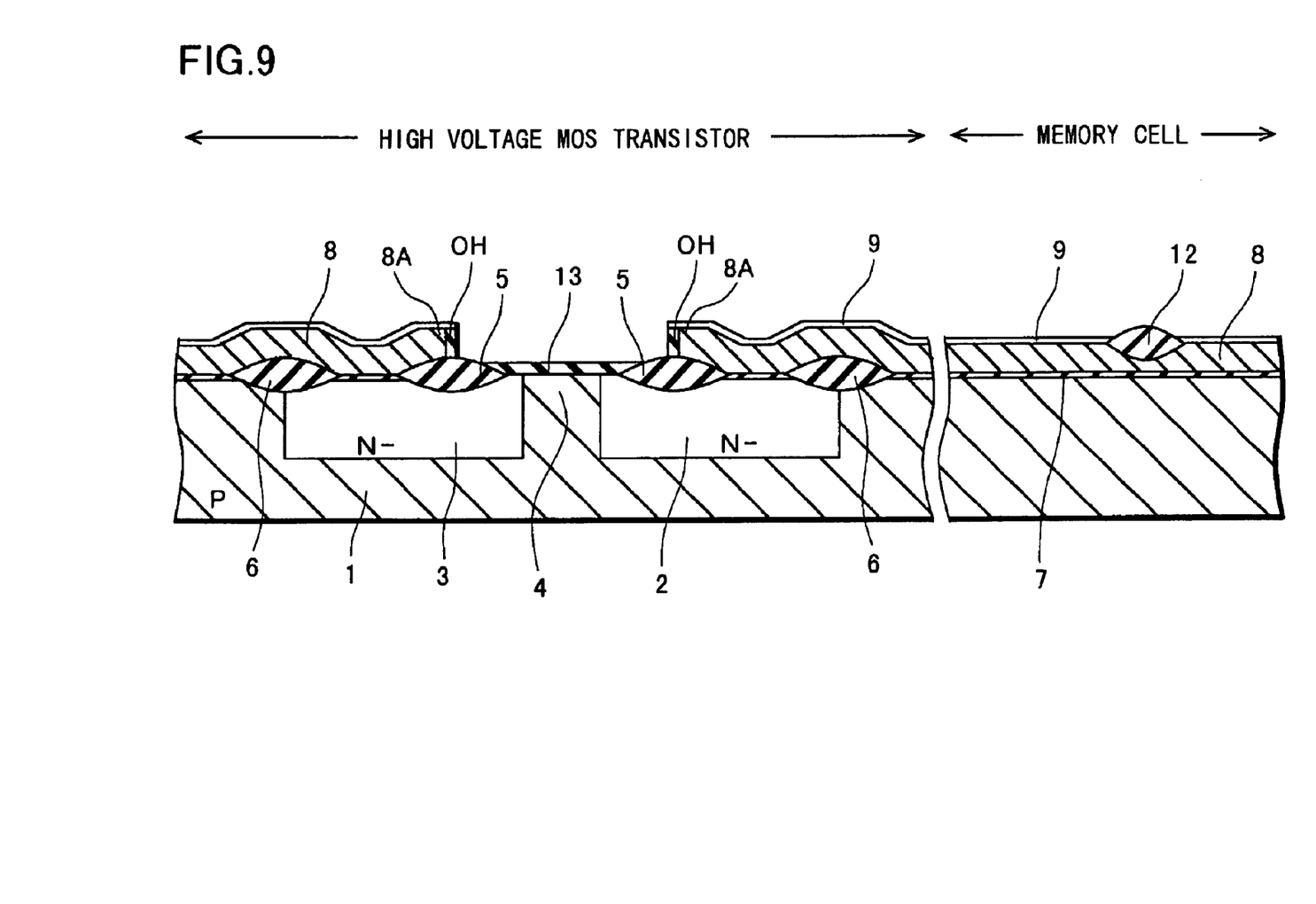
FIG. 9 is a sectional view showing a method of manufacturing a semiconductor device according to the second embodiment of this invention.

As seen from FIG. 9, after the photoresist layer PR2 has been removed, by thermal oxidation, an oxide film 12 having a thickness of about 150 nm in a LOCOS shape is formed on the region where a floating gate is to be formed. Specifically, the oxide film 12 is formed by the "selective oxidation" using the silicon nitride film 10 as an oxidation-resistant film.

During this thermal oxidation step, a thick gate insulating film 13 having a thickness of about 150 nm is also formed in the region where the high voltage MOS transistor is to be formed. In this case, the side 8A of the polysilicon layer is oxidized so that an oxide film piece OH is formed.

Figure 10:
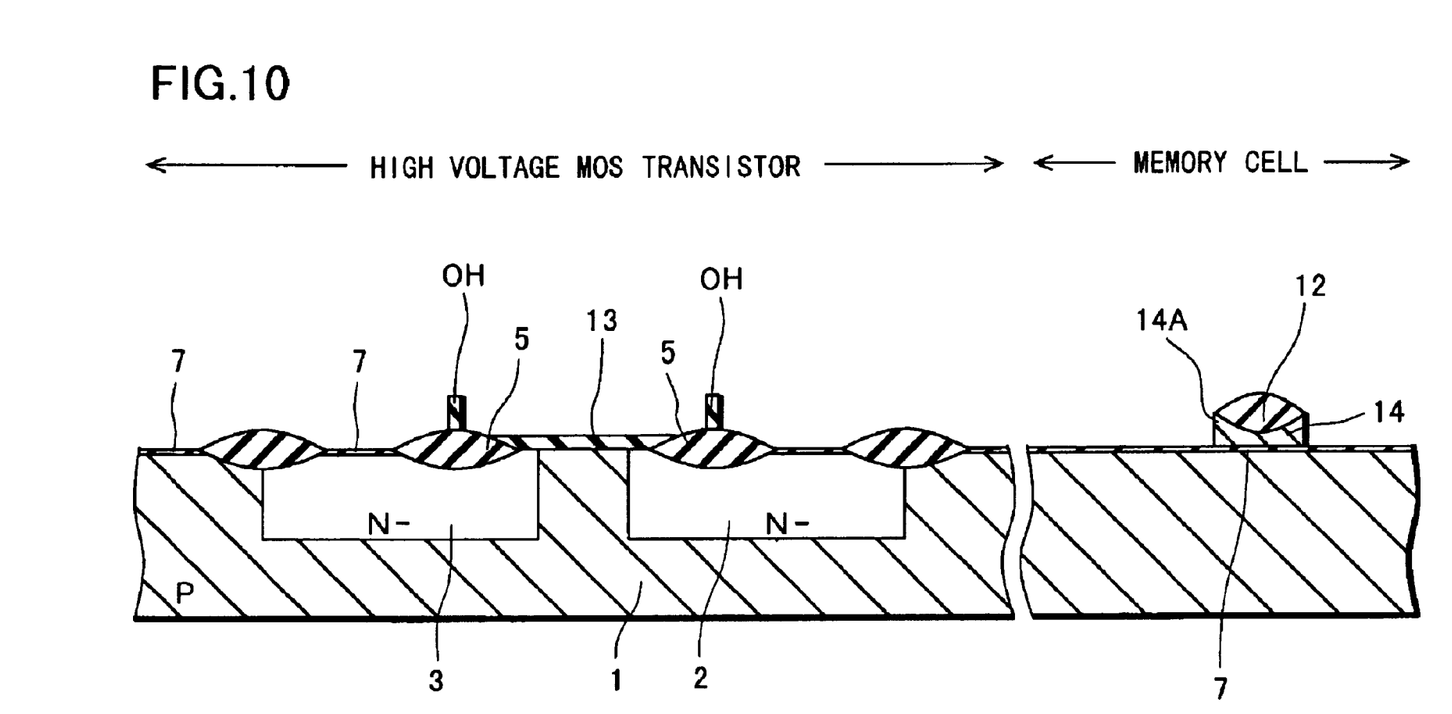
FIG. 10 is a sectional view showing a method of manufacturing a semiconductor device according to the second embodiment of this invention.

Next, the silicon nitride film SN is removed using hot phosphoric acid. Further, when the polysilicon layer 8 is etched using as a mask the oxide film 12 in the LOS shape as shown in FIG. 10, a floating gate 14 is formed beneath the oxide film 12 in the LOCOS shape.

As a result, the corner 14A of the floating gate 14 is processed into an acute shape. Hence, as described later, the tunneling current becomes likely to flow the floating gate to the control gate. In this embodiment, it should be noted that the oxide film OH remains on the LOCOS film 5.

Figure 11:
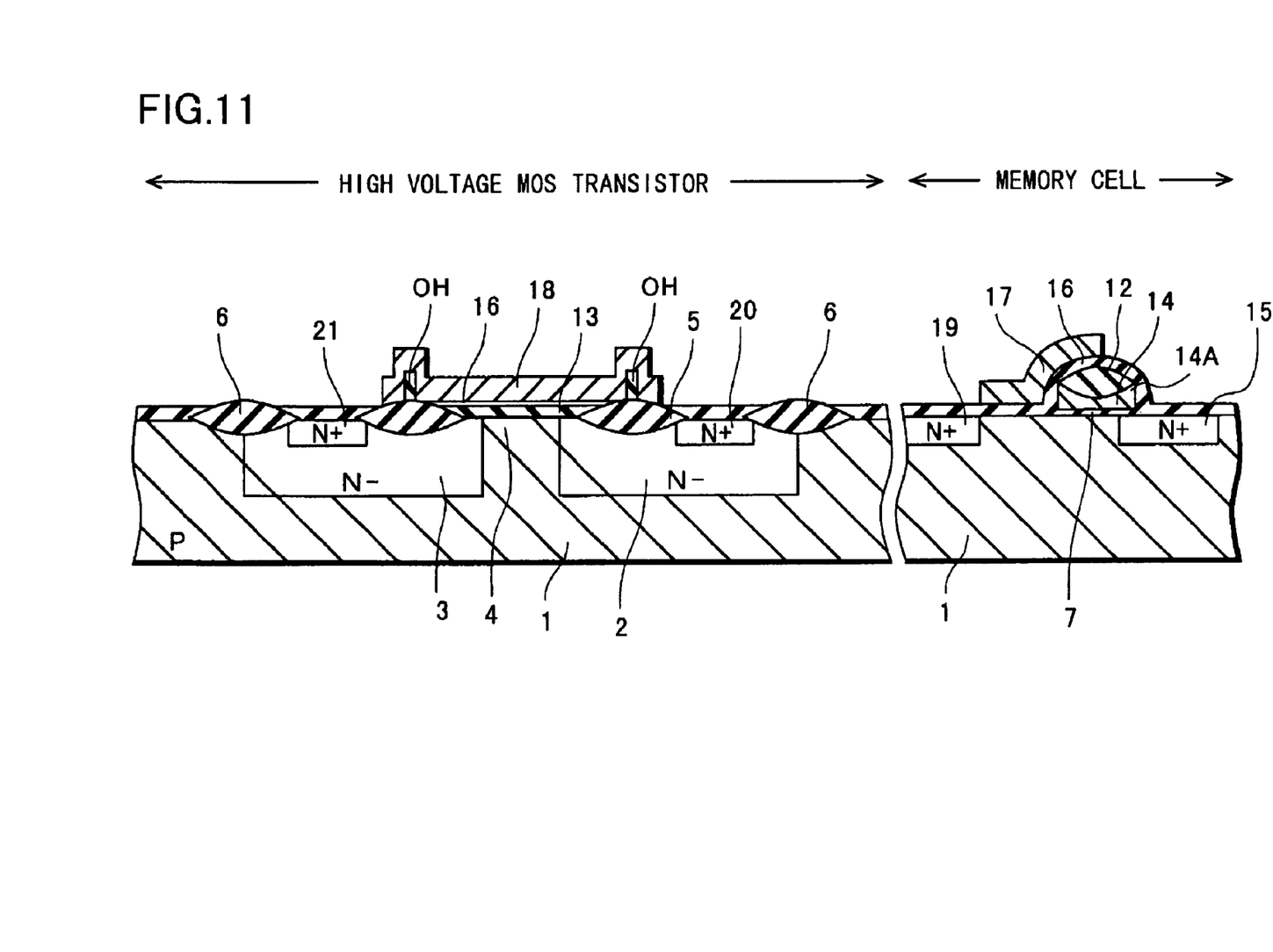
FIG. 11 is a sectional view showing a method of manufacturing a semiconductor device according to the second embodiment of this invention.

Next, as seen from FIG. 11, a self-aligned n$^+$ source diffused layer 15 is formed at the one end on the source side of the floating gate 14 by ion-implanting boron and thermally diffusing the implanted ions. Further, a tunneling insulating film 16 having a thickness of about 20 nm is formed to cover the floating gate 14 and oxide film 12 of the non-volatile memory cell. The tunneling insulating film 16 can be formed by thermal oxidation and CVD technique.

Thus, the upper surface and side surface of the floating gate 14 are covered with the tunneling insulating film 16. The tunneling insulating film 16 is formed on the entire surface of the substrate 1. Therefore, the tunneling insulating film 16 is superposed on the thick gate insulating film 13 of the high voltage MOS transistor. Correspondingly, the effective film thickness of the gate insulating film of the high voltage MOS transistor can be increased.

By selectively etching the tunnel insulating film 16 formed on the thick gate insulating film 13, the thickness of the gate insulating film of the high voltage MOS transistor can be made equal to that of the thick gate insulating film 13.

It should be noted that the conventional type MOS transistor is also formed on the same Si substrate 1. The above thin gate insulating film 7 is used as the gate insulating film of the conventional type MOS transistor. Therefore, the tunneling insulating film 16 superposed on the thin gate insulating film 7 is selectively etched away. This etching step can be executed simultaneously with the step of selectively etching the tunnel insulating film 16 formed on the above thick gate insulating film 13.

Thereafter, the surface of the Si substrate 1 is cleaned by the ordinary technique. A poly-Si layer having a thickness of about 200 nm and doped with phosphorous is formed on the entire surface of the substrate by the LPCVD method.

The poly-Si layer is selectively etched by the photolithography technique so that a control gate 17 of the non-volatile memory cell and the gate electrode 18 of the high voltage MOS transistor are formed.

Now, the gate electrode 18 of the high voltage MOS transistor is formed so that it resides on the gate insulating film 13 and a part of the LOCOS film 5 so as to cover the oxide film OH on the LOCOS film 5. Covering the oxide film piece OH with the gate electrode 18 prevents dust from being generated due to peeling-off of the oxide film piece OH.

The control gate 17 of the non-volatile memory cell is formed over the area extending from the floating gate 14 to the p type Si substrate 1. Thereafter, by ion-implanting arsenic, formed are an n+ type drain region 19 of the non-volatile memory cell and an n+ type source diffused layer 20 and an n+ type drain diffused layer 21 of the high voltage MOS transistor.

In this embodiment, after the silicon nitride film SN has been stacked on the poly-Si layer 8, the poly-Si layer 8 on the region of the high voltage MOS transistor where the gate insulating film is to be formed is etched away. This embodiment is different from the first embodiment in this point. Therefore, during the subsequent thermal oxidation, as a result of oxidation of the side of the poly-Si layer 8, the oxide film piece OH remains on the LOCOS film 5. The remaining oxide film piece OH is apt to peel off, thus generating dust. In order to obviate such an inconvenience, the oxide film piece OH is covered with the gate electrode 18, thereby preventing the oxide film piece from peeling off.

The operation and the non-volatile memory cell and the withstand characteristic of the high voltage MOS transistor, which are the same as in the first embodiment, are not explained here.

In this way, in accordance with this invention, the non-volatile memory cell and high voltage MOS transistor can be formed on the same Si chip. A brief explanation will be given of the operation of the non-volatile memory cell.

With the side of the first Si layer covered with the oxidation resistant film, the oxide film in the LOCOS shape is formed by thermal oxidation in the region where the floating gate is formed, and the gate insulating film is also formed in the region where the MOS transistor is to be formed. For this reason, the side of the first Si layer is not oxidized. This prevents the oxide film at the side wall from remaining on the LOCOS film 5 to generate dust, or prevents the flatness of an interlayer insulating film formed as an overlying layer from being impaired.

With the side of the first Si layer not covered with the oxidation-resistant film, the oxide film in the LOCOS shape is formed by thermal oxidation in the region where the floating gate is to be formed and the gate insulating film is also formed in the region where the MOS transistor is to be formed. In this case, since the side wall of the first Si layer is oxidized. In the subsequent step of forming the control gate, the control gate is formed to cover the oxide film piece, thereby preventing the oxide film piece from peeling off.

What is claimed is:

1. A method of manufacturing a semiconductor device having a non-volatile memory cell transistor with a control gate stacked on a floating gate through an oxide film and a MOS transistor on the same semiconductor substrate, said method comprising:

simultaneously and selectively forming the oxide film on the floating gate of the non-volatile memory cell transistor and a gate insulating film of the MOS transistor in a single thermal oxidation step;

forming a tunneling insulating film over the gate insulating film and the oxide film; and selectively etching the tunnel insulating film on the region of the semiconductor substrate where the MOS transistor is to be formed.

2. The method of claim 1, wherein the gate insulating film is approximately 150 nanometers thick.

3. The method of claim 1 including forming on the substrate a first MOS transistor for a first voltage and a second MOS transistor for a voltage higher than the first voltage, wherein during said selective etching of the tunnel insulating film, the tunnel insulating film is etched on the region where the first MOS transistor is to be formed.

4. A method of manufacturing a semiconductor device having a non-volatile memory cell transistor with a control sate stacked on a floating gate through an oxide film and a MOS transistor on the same semiconductor substrate, said method comprising:

forming a silicon layer on the semiconductor substrate;

selectively removing the silicon layer on a region of the semiconductor substrate where the MOS transistor is to be formed;

forming an oxidation-resistant film over a first entire resulting surface;

selectively removing the oxidation-resistant layer on the region of the semiconductor substrate where the MOS transistor is to be formed and on a region of the semiconductor substrate where the floating gate of the non-volatile memory cell transistor is to be formed;

simultaneously and selectively forming an oxide film on the region where the floating gate is to be formed and a gate insulating film on the region where the MOS transistor is to be formed;

forming a tunneling insulating film over the gate insulating film and the oxide film; and selectively etching the tunnel insulating film on the region of the semiconductor substrate where the MOS transistor is to be formed.

5. The method of claim 4, wherein said oxidation-resistant film is a silicon nitride film.

6. The method of claim 4 wherein the oxide film is formed by a single thermal oxidation step.

7. The method of claim 4, wherein the gate insulating film is approximately 150 nanometers thick.

8. The method of claim 4 including forming on the substrate a first MOS transistor for a first voltage and a second MOS transistor for a voltage higher than the first voltage, wherein during said selective etching of the tunnel insulating film, the tunnel insulating film is etched on the region where the first MOS transistor is to be formed.

9. A method of manufacturing a semiconductor device having a non-volatile memory cell transistor with a control gate stacked on a floating gate through an oxide film and a MOS transistor on a same semiconductor substrate, said method comprising:

forming a gate insulating film on the semiconductor substrate;

forming a silicon layer on the gate insulating film;

selectively removing the silicon layer on a region of the semiconductor substrate where the MOS transistor is to be formed;

forming an oxidation-resistant film over a first entire resulting surface;

selectively removing the oxidation-resistant layer on the region of the semiconductor substrate where the high voltage MOS transistor is to be formed and on a region of the semiconductor substrate where the floating sate of the non-volatile memory cell transistor is to be formed;

simultaneously and selectively forming an oxide film on the region where the floating gate is to be formed and a gate insulating film on the region where the high voltage MOS transistor is to be formed;

removing at least some of the remaining oxidation-resistant film;

forming a tunnel insulating film over the gate insulating film and the oxide film; and selectively etching the tunnel insulating film on the region of the semiconductor substrate where the MOS transistor is to be formed.

10. The method of claim 9 wherein said oxidation-resistant layer is a silicon nitride layer.

11. The method of claim 9 wherein the oxide film is formed by a single thermal oxidation step.

12. The method of claim 9, wherein the gate insulating film is approximately 150 nanometers thick.

13. The method of claim 9 including forming on the substrate a first MOS transistor for a first voltage and a second MOS transistor for a voltage higher than the first voltage, wherein during said selective etching of the tunnel insulating film, the tunnel insulating film is etched on the region where the first MOS transistor is to be formed.

* * * * *